United States Patent
Nhuyen (10) Patent No.: US 7,307,568 B1
(45) Date of Patent: Dec. 11, 2007

(54) RETURN-TO-HOLD SWITCHING SCHEME FOR DAC OUTPUT STAGE

(75) Inventor: Khiem Nhuyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/476,476

(22) Filed: Jun. 28, 2006

(51) Int. Cl.
   *H03M 1/66* (2006.01)
(52) U.S. Cl. .................................... 341/144; 341/118
(58) Field of Classification Search ......... 341/130–172
   See application file for complete search history.

(56) References Cited

U.S. PATENT DOCUMENTS 6,061,010 A    5/2000  Adams et al.
6,545,622 B1*  4/2003  Kamal et al. ............... 341/144
6,917,316 B2*  7/2005  Blackburn .................. 341/144

OTHER PUBLICATIONS

"A Low Power Current Steering Digital to Analog Converter In 0.18 Micron CMOS"; Mercer et al.; Analog Devices Inc., Wilmington, MA USA; pp. 72-77, Aug. 2005.
"A 114-dB SNR Oversampling DAC with Segmented Noise-Shaped Scrambling"; Adams et al.; IEEE Journal of Solid-State Circuits; vol. 33, No. 12, Dec. 1998; pp. 1871-1878.

* cited by examiner

*Primary Examiner*—Lam T. Mai
(74) *Attorney, Agent, or Firm*—Gauthier & Connors LLP (57) ABSTRACT

A novel clock control circuit completely removes the inter-symbol interference (ISI) in the DAC output waveform without any significant increase in power consumption and silicon area of the DAC. The novel circuit does not increase the requirement for slew rate and bandwidth of the amplifier.

20 Claims, 7 Drawing Sheets

Figure 7: Schematic the control logic for the return-to-hold signals

RETURN-TO-HOLD SWITCHING SCHEME FOR DAC OUTPUT STAGE

BACKGROUND OF THE INVENTION

1. Field of Invention

This invention relates to mixed-signal converters of the current steering type, and more particularly, to sigma-delta digital-to-analog converter that employs a continuous-time current-to-voltage circuit in the output stage.

2. Discussion of Prior Art

Figure 1:
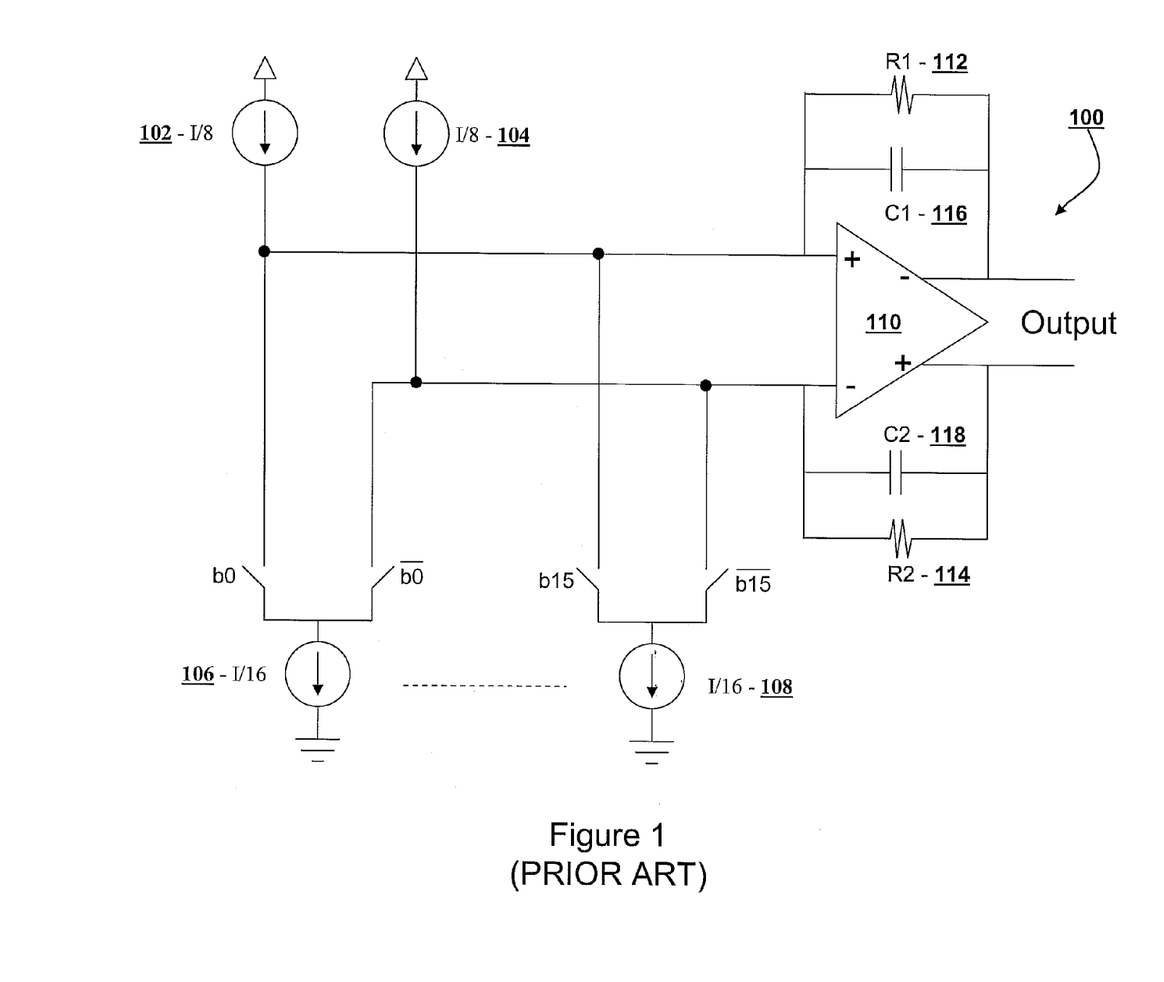
FIG. 1 illustrates a typical implementation of a 16-level thermometer code current steering DAC

Current steering topology is a commonly used approach in industry to realize digital-to-analog converters. Due to its simplicity and flexibility, this topology is employed in a large combination of high speed or high resolution applications. FIG. 1 illustrates a typical implementation of a 16-level thermometer-code current steering DAC 100. The DAC consists of a bank of current steering cells 102, 104, 106, and 108, amplifier 110, a pair of feedback resistors 112 and 114, and in some cases a pair of capacitors, C1 116 and C2 118. Capacitors 116 and 118 effectively slow down the step output waveform to help reduce the amplifier slew rate requirement. The control bits and their complementary version are, in the simplest form, the Q and QB outputs of a D-flip flop array. The inputs of these D-flip flops are the digital DAC codes. The circuit operation is quite simple in that the digital codes control how many cells will be directed to the appropriate summing junction of the amplifier. A clock which defines the conversion rate of the DAC is used to synchronize all output transitions of the control bits via the D-flip flops.

Sigma-delta digital-to-analog converters (DACs) provide for a means to achieve high resolution and low distortion at a relatively low cost compared to traditional Nyquist converters. In the past, there have been many realizations of these very high resolution DACs which used current steering topology in their output stage. Examples of such implementations can be found in the paper by Douglas Mercer titled "A Low Power Current Steering Digital to Analog Converter in 0.18 Micron CMOS" and in the paper by Adams et al. titled "A 113-dB SNR Oversampling DAC with Segmented Noise-Shaped Scrambling".

The above-mentioned paper by Douglas Mercer teaches a plurality of circuit techniques that address the DC and AC distortion performance of a low-power current steering Digital-to-Analog Converter design. Mercer's techniques resulted in AC distortion equal to high power DACs with dissipation as much as 10 times larger.

The above-mentioned paper by Adams et al. teaches a sigma-delta digital-to-analog converter implemented in a 0.6 micron CMOS and using a 6-bit modulator together with a segmented noise-shaped scrambling scheme to achieve 113-dB A-weighted dynamic range over a 20-kHz bandwidth. Adams' output stage uses a dual return-to-zero circuit that eliminates errors caused by inter-symbol interference (ISI).

Figure 2:
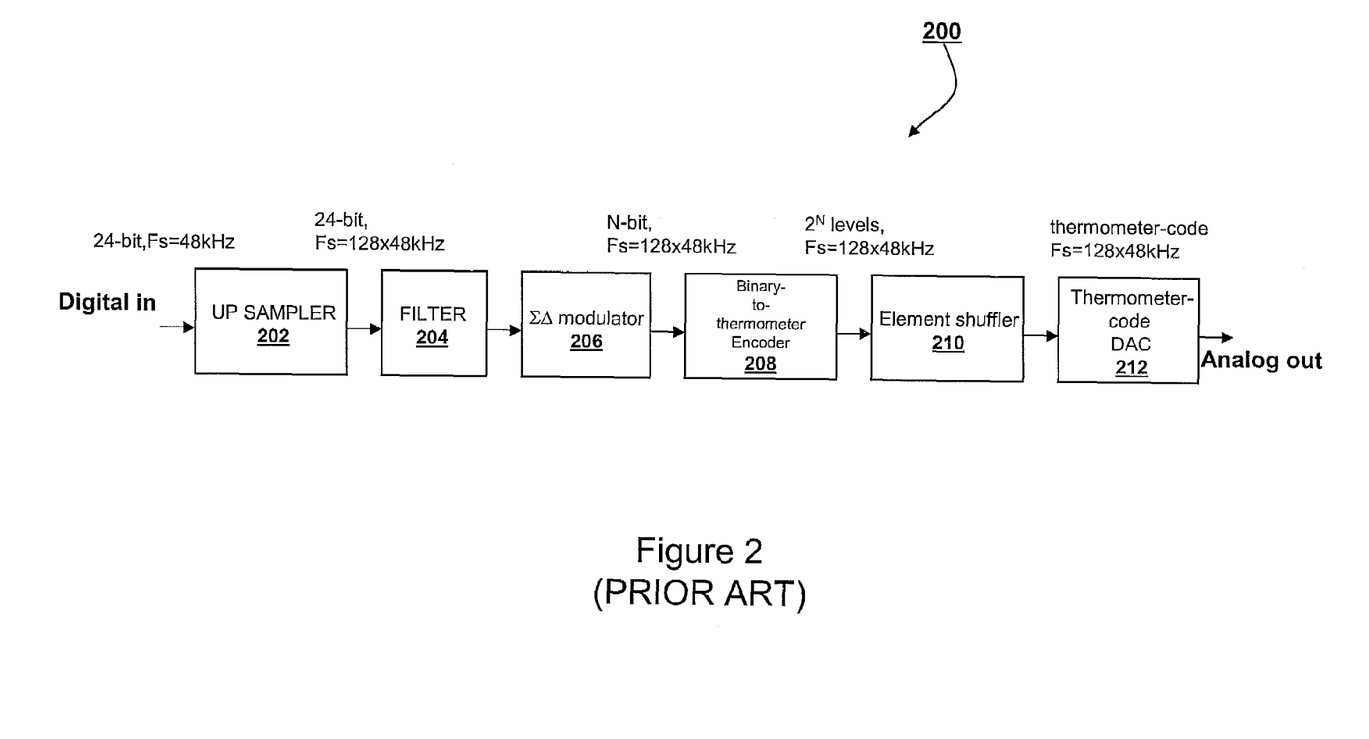
FIG. 2 illustrates a block diagram of a multi-bit $\Sigma\Delta$ DAC employing current steering output stage

FIG. 2 illustrates a block diagram of a prior art audio band multi-bit sigma-delta DAC 200 employing current steering output stage. The converter consists of an up-sampler 202 to up-sample the digital input to the designed operating frequency of the system, typically, at 128 times the input sample rate Fs (Fs=48 kHz). The output of up-sampler 202 is input into digital filter 204, which filters the images resulting from the up-sampling process. A sigma-delta modulator 206 then reduces the output word-width of the digital filter, typically from 24 bit, down to a more manageable size, typically 4 to 6 bit. This modulation essentially trades off the out-of-band noise for a smaller word-width by pushing the truncation errors into the higher unused frequency region. Binary-to-thermometer encoder 208 is then used to encode the binary weighted data into thermometer code data. The output of binary-to-thermometer encoder 208 is a set of $2^N$ elements, where N is the designed word-width of the modulator output. Each element of this set will then drive a current cell in the bank of current cells. To ensure the linearity of this bank of current cells, a data selection logic (also called shuffler or scrambler) 210 is then used to select a subset of the $2^N$ elements according to the digital code from the thermometer encoder output. The output voltage is produced by converting the sum of the selected current cells into voltage via a current-to-voltage (I-to-V) converter. The output of element shuffler 210 is fed into thermometer-code DAC 212. To filter out the out-of-band noise, a post-analog filter (not shown) is typically used.

A very well understood problem associated with current steering DAC is the inter-symbol-interference (ISI). This ISI problem is the result of un-equal rise and fall time in the waveform of the current pulse delivered to the output by each current cell. Consequently, the present value of the DAC output depends on its previous value. The net effect is a major degradation in the total harmonic distortion (THD) and noise performance of the DAC.

Figure 3:
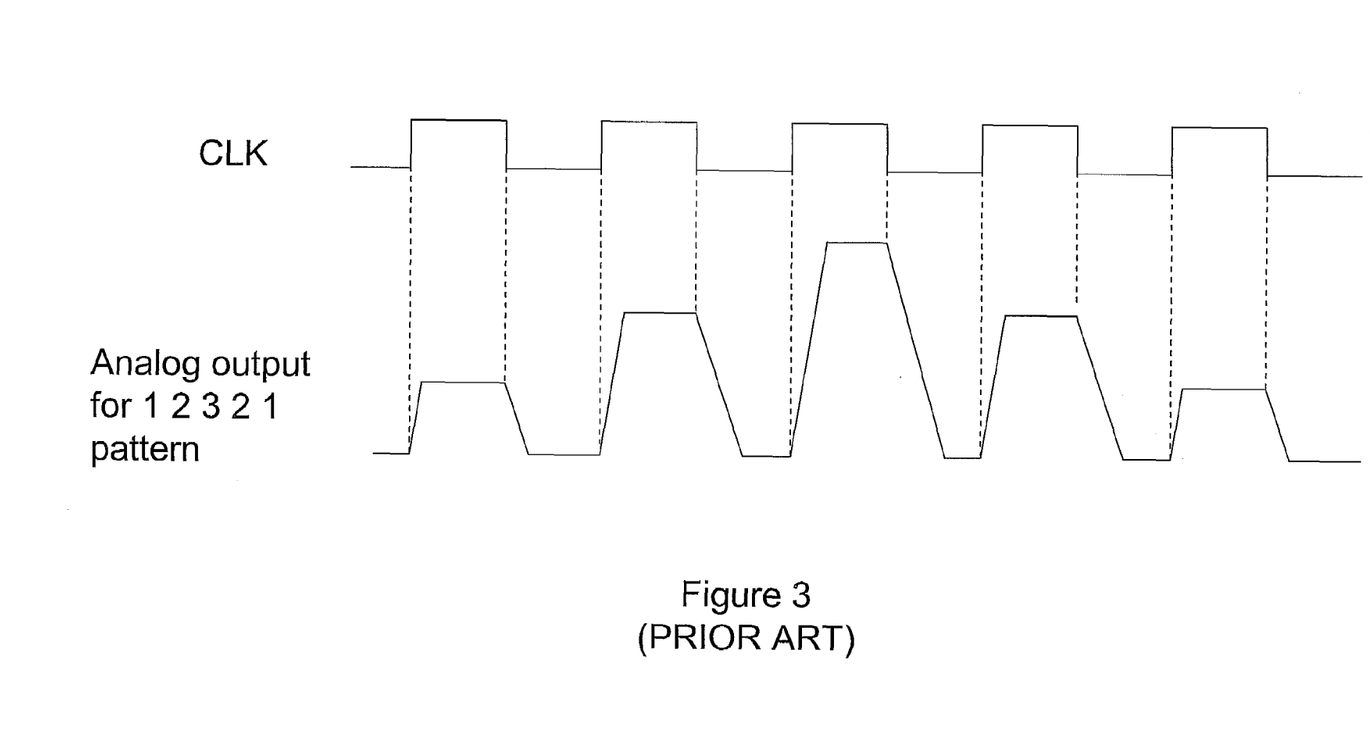
FIG. 3 illustrates a return-to-zero waveform

Prior art techniques such as the return-to-zero (RTZ) technique, was used to minimize the effect of ISI. The principle of RTZ is illustrated in FIG. 3. RTZ forces each current cell to turn off for a duration, typically half of the clock period. Hence, the output of the DAC always starts from zero at the beginning of each clock period. The ISI is thus completely removed. The major drawbacks of this technique include a high slew rate, bandwidth requirement and high power consumption in the amplifier; additional high frequency content introduced as the result of returning to the zero state. Further, the subsequent filtering stage of the DAC will have to be very linear, a challenging task in its own, to avoid distortions that may cause by such a high dynamic output from the DAC.

Figure 4:
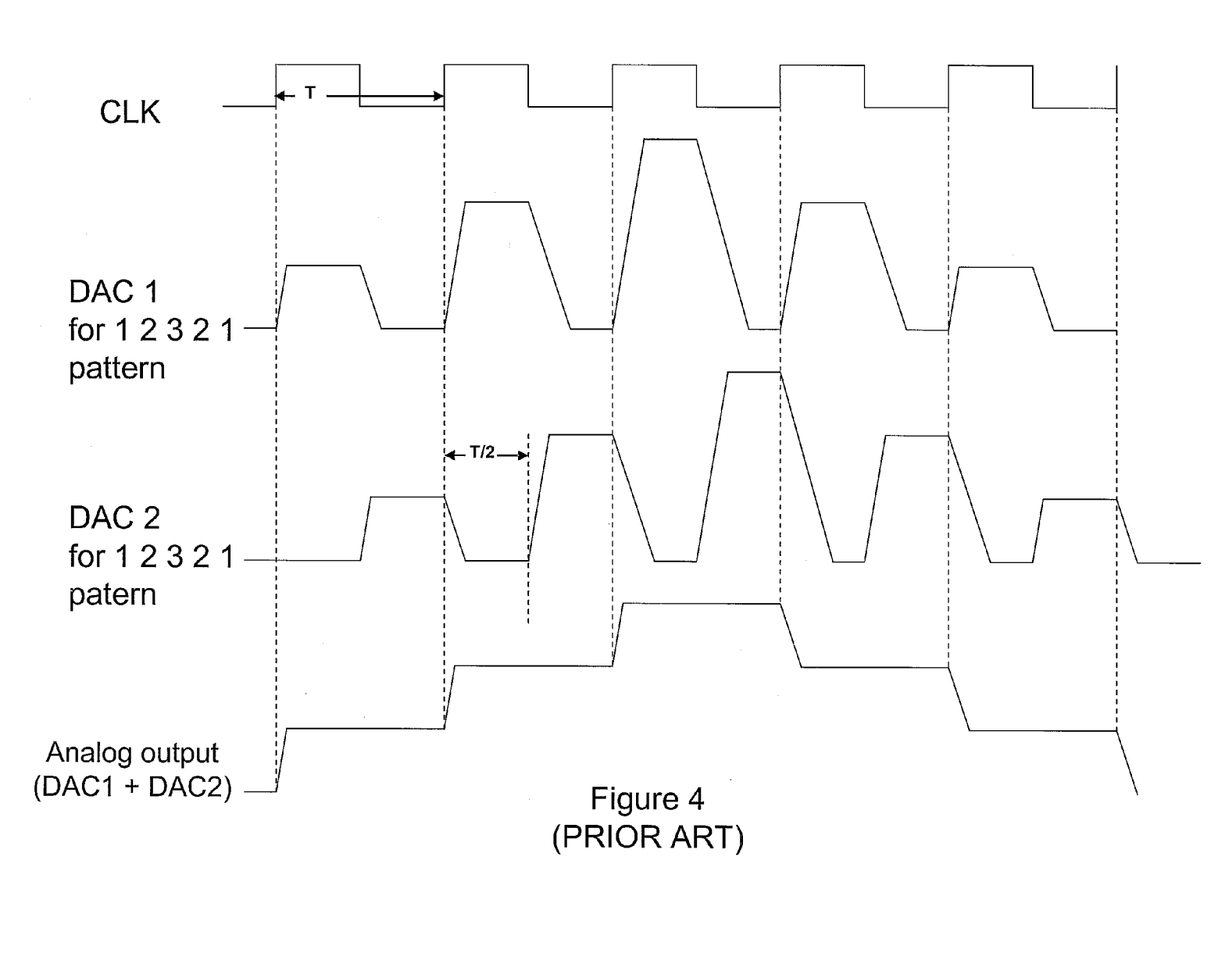
FIG. 4 illustrates a dual-return-to-zero waveform

FIG. 4 illustrates the dual RTZ technique which sums the output of two RTZ waveforms which are delayed by half of the clock period from each other. The previously described paper to Adams et al. and the U.S. Pat. No. 6,061,010 titled, "Dual return-to-zero pulse encoding in a DAC output stage" teaches for such a dual RTZ technique. By the principle of superposition theorem, the sum of two ISI-free waveforms must yield an ISI free output. The major draw back of this technique is the addition of the second current bank used to create the delayed RTZ waveform. This addition doubles the silicon area, consumes twice the amount of power and complicates the clock scheme and data synchronization between the digital and analog interface of the DAC.

Prior art low ISI gate drive circuitries can help reducing the effects of ISI by ensuring that the current cell always sees the same symmetrical disturbance at its drain when the control bits make a transition from 1 to 0, and from 0 to 1. It has been known that this type of circuit cannot eliminate ISI completely. Further, when the logic makes a transition, it draws a large current spike from the supply making it not suitable for low power consumption implementation.

Whatever the precise merits, features, and advantages of the above cited references and techniques, none of them achieves or fulfills the purposes of the present invention.

SUMMARY OF THE INVENTION

The invention provides for a clock control circuit and a method to completely remove the ISI in the DAC output waveform without any significant increase in power consumption and silicon area of the DAC. Further, the invention does not increase the requirement for slew rate and bandwidth of the amplifier as typically found in prior art.

The present invention provides for a method to eliminate inter-symbol interference error at an I-to-V output stage of a current steering DAC having a plurality of current cells, wherein the output stage comprises at least an I-to-V amplifier having summing junctions SJP and SJN, feedback resistances R1 and R2, and feedback capacitances C1 and C2. In this embodiment, the method comprises the steps of: (a) disconnecting the feedback resistors R1 and R2 and the current cells from the summing junctions SJP and SJN of the amplifier in the output stage; (b) connecting the feedback resistors R1 and R2 together to form a resistor string across outputs of the output stage, with the feedback capacitors C1 and C2 creating a hold period to hold output voltage of the I-to-V amplifier when the I-to-V amplifier is not connected to the current cells of the current steering DAC; (c) using the I-to-V amplifier as a buffer to maintain a CM level at drains of the current cells during the hold period by connecting the outputs of the current cells to midpoint of the resistor string; and changing DAC codes while outputs of the current cells are in the hold mode, and (d) disconnecting the outputs of the current cells from each other after the DAC codes are changed and re-connecting the feedback resistors and appropriate outputs of the current cells back to the summing junctions of the I-to-V converter.

The present invention also provides for an apparatus to eliminate inter-symbol interference error at an I-to-V output stage of a current steering DAC having a plurality of current cells, wherein the output stage comprises at least an I-to-V amplifier having summing junctions SJP and SJN, feedback resistances R1 and R2, and feedback capacitances C1 and C2. In this embodiment, the apparatus comprises: (a) means for disconnecting the feedback resistors R1 and R2 and the current cells from the summing junctions SJP and SJN of the amplifier in the output stage; (b) means for connecting the feedback resistors R1 and R2 together to form a resistor string across outputs of the output stage, with the feedback capacitors C1 and C2 creating a hold period to hold output voltage of the I-to-V amplifier when the where the I-to-V amplifier is not connected to the current cells of the current steering DAC; (c) means for using the I-to-V amplifier as a buffer to maintain a CM level at drains of the current cells during the hold period by connecting the outputs of the current cells to midpoint of the resistor string; and changing DAC codes while outputs of the current cells are in the hold mode, and (d) means for disconnecting the outputs of the current cells from each other after the DAC codes are changed and re-connecting the feedback resistors and appropriate outputs of the current cells back to the summing junctions of the I-to-V converter.

The present invention also provides for a circuit to eliminate inter-symbol interference error at an I-to-V output stage of a current steering DAC having a plurality of current cells, wherein the circuit comprises: (a) an I-to-V amplifier having summing junctions SJP and SJN; (b) a first feedback resistance R1; (c) a second feedback resistance R2; (d) a first feedback capacitance C1; (e) a second feedback capacitance C2; (f) a first switch S1 used to connect/disconnect R1 to the summing junction SJP and a second switch S2 used to connect/disconnect R2 to the summing junction SJN; (g) a third switch S3 used to connect/disconnect the feedback resistors R1 and R2 together and, when connected, R1 and R2 forming a resistor string across outputs of the output stage, with the feedback capacitors C1 and C2 creating a hold period to hold output voltage of the I-to-V amplifier when the I-to-V amplifier is not connected to the current cells of the current steering DAC; and wherein the I-to-V amplifier acts as a buffer to maintain a CM level at drains of the current cells during the hold period by connecting the outputs of the current cells to midpoint of the resistor string and, after DAC codes are changed, the outputs of the current cells are disconnected from each other and the feedback resistors and appropriate outputs of the current cells are reconnected back to the summing junctions of the I-to-V converter.

The present invention also provides for a circuit to eliminate inter-symbol interference error at an I-to-V output stage of a current steering DAC having a plurality of current cells, wherein the circuit comprises: (a) a first switch S1 used to connect/disconnect feedback resistance R1 to a summing junction SJP of a I-to-V amplifier; (b) a second switch S2 used to connect/disconnect feedback resistance R2 to the summing junction SJN of the I-to-V amplifier; (c) a third switch S3 used to connect/disconnect the feedback resistors R1 and R2 together and, when connected, R1 and R2 forming a resistor string across outputs of the output stage, with the feedback capacitors C1 and C2 creating a hold period to hold output voltage of the I-to-V amplifier when the I-to-V amplifier is not connected to the current cells of the current steering DAC; and wherein the I-to-V amplifier acts as a buffer to maintain a CM level at drains of the current cells during the hold period by connecting the outputs of the current cells to midpoint of the resistor string and, after DAC codes are changed, the outputs of the current cells are disconnected from each other and the feedback resistors and appropriate outputs of the current cells are reconnected back to the summing junctions of the I-to-V amplifier.

DESCRIPTION OF THE PREFERRED EMBODIMENTS

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Figure 5:
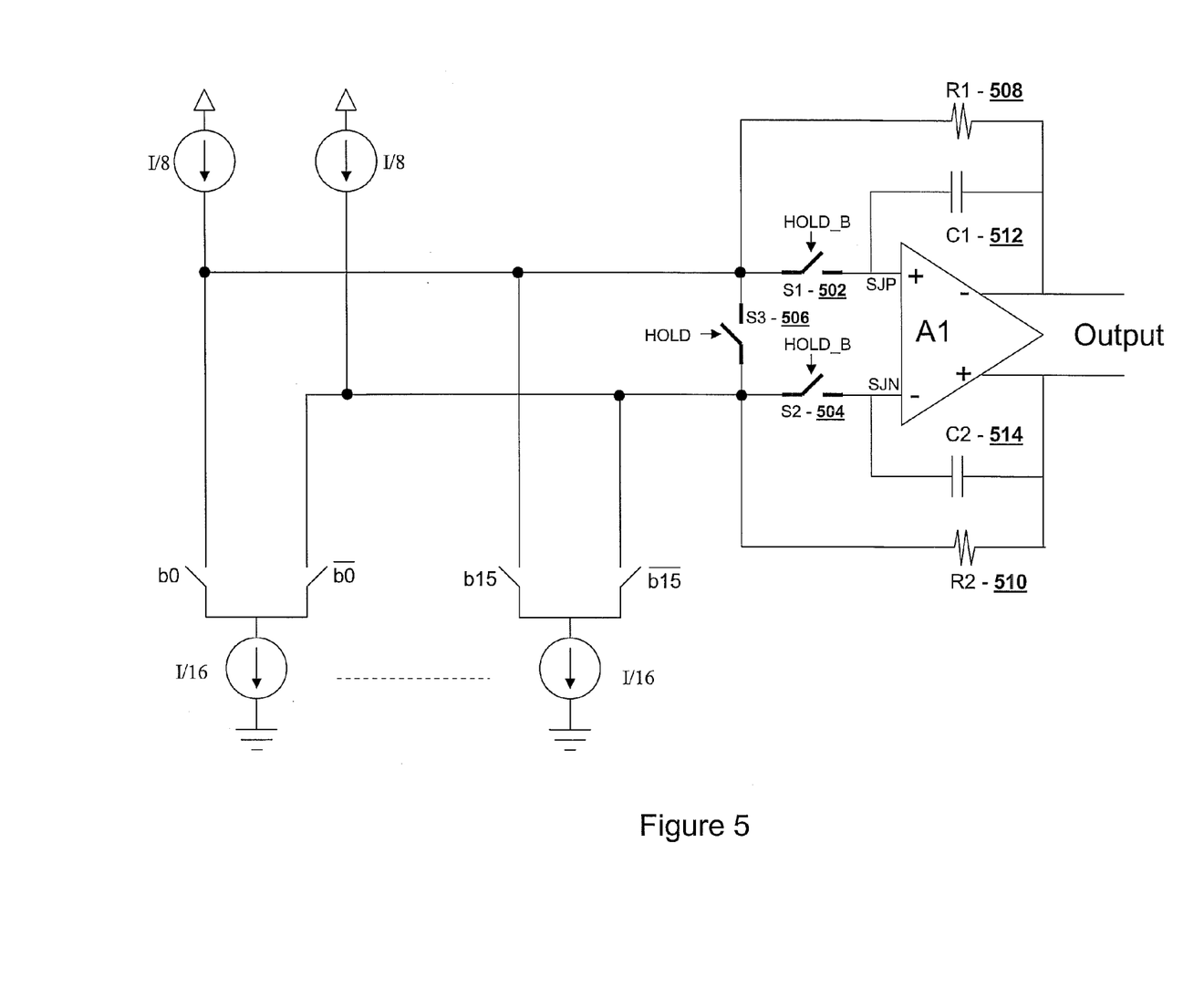
FIG. 5 illustrates a block diagram of the return-to-hold scheme
Figure 6:
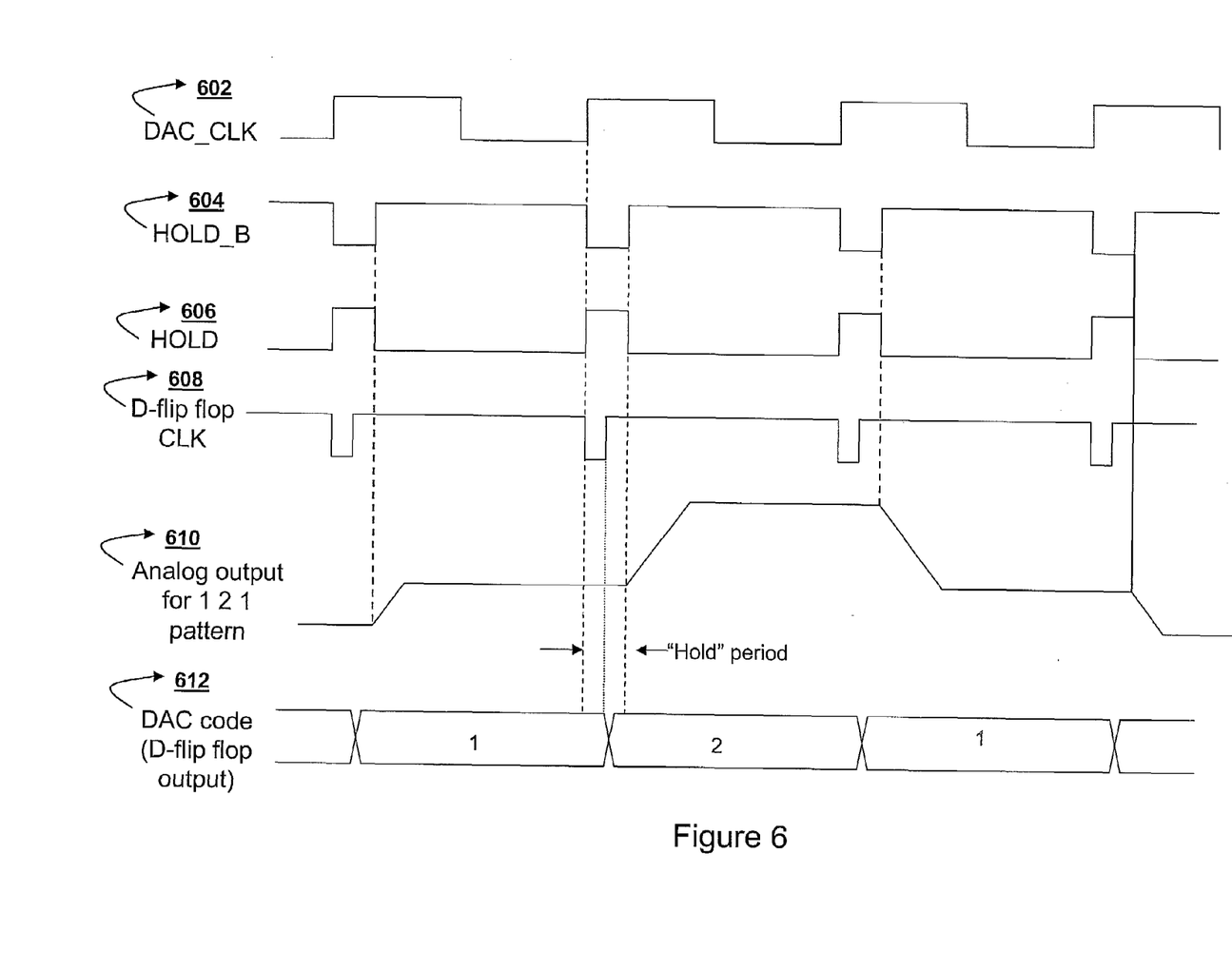
FIG. 6 illustrates a timing diagram of the return-to-hold

FIG. 5 illustrates a block diagram of the present invention's return-to-hold scheme wherein the current steering DAC output stage with the addition of switches S1 502, S2 504, and S3 506. Switches S1 502 and S2 504 are controlled by a HOLD_B signal while switch S3 506 is controlled by a HOLD signal. The timing diagram of the clock, the current cell control bits and the control signals are shown in FIG. 6.

The operation of the circuit is described as follows. When the rising edge of the clock 602 arrives, HOLD_B 604 becomes LOW and disconnects the feedback resistors R1 508 and R2 510 from the summing junctions of the I-to-V converter by turning off switches S1502 and S2 504. At the same time, HOLD 606 becomes HIGH and connects the left hand sides of the resistors R1 508 and R2 510 via switch S3 506. The outputs of the current cells are also short circuited together via switch S3 506. During this "hold" period, the I-to-V converter is in the "hold" mode, its output voltage is kept at the same value by the capacitors C1 512 and C2 514. Hence, the switching scheme is named return-to-hold. Since resistors R1 508 and R2 510 are connected across the positive and negative outputs of the I-to-V converter, the mid-point of this resistor string (the terminals of switch S3 506) is set at the output common-mode (CM) voltage of the amplifier A1. Since the output current cells are connected to this point, amplifier A1 is acting as a CM buffer and holds their drains at the CM level, eliminating the need for an extra CM buffer.

During the "hold" period, DAC code 612 is changed, but analog output 610 is unchanged since the feedback resistor R1 508 and R2 510 are still disconnected from the summing junctions SJP and SJN. When the "hold" period ends, S3 506 is turned off, S1 502 and S2 504 are turned on. Resistors R1 508 and R2 510 are connected back to SJP and SJN allowing the DAC current to be converted to the output voltage. Since the DAC code 612 changes during the "hold" period, the output has no information or memory about the rise and fall time of each individual switching current cell. The output voltage then is free of inter-symbol interference.

Figure 7:
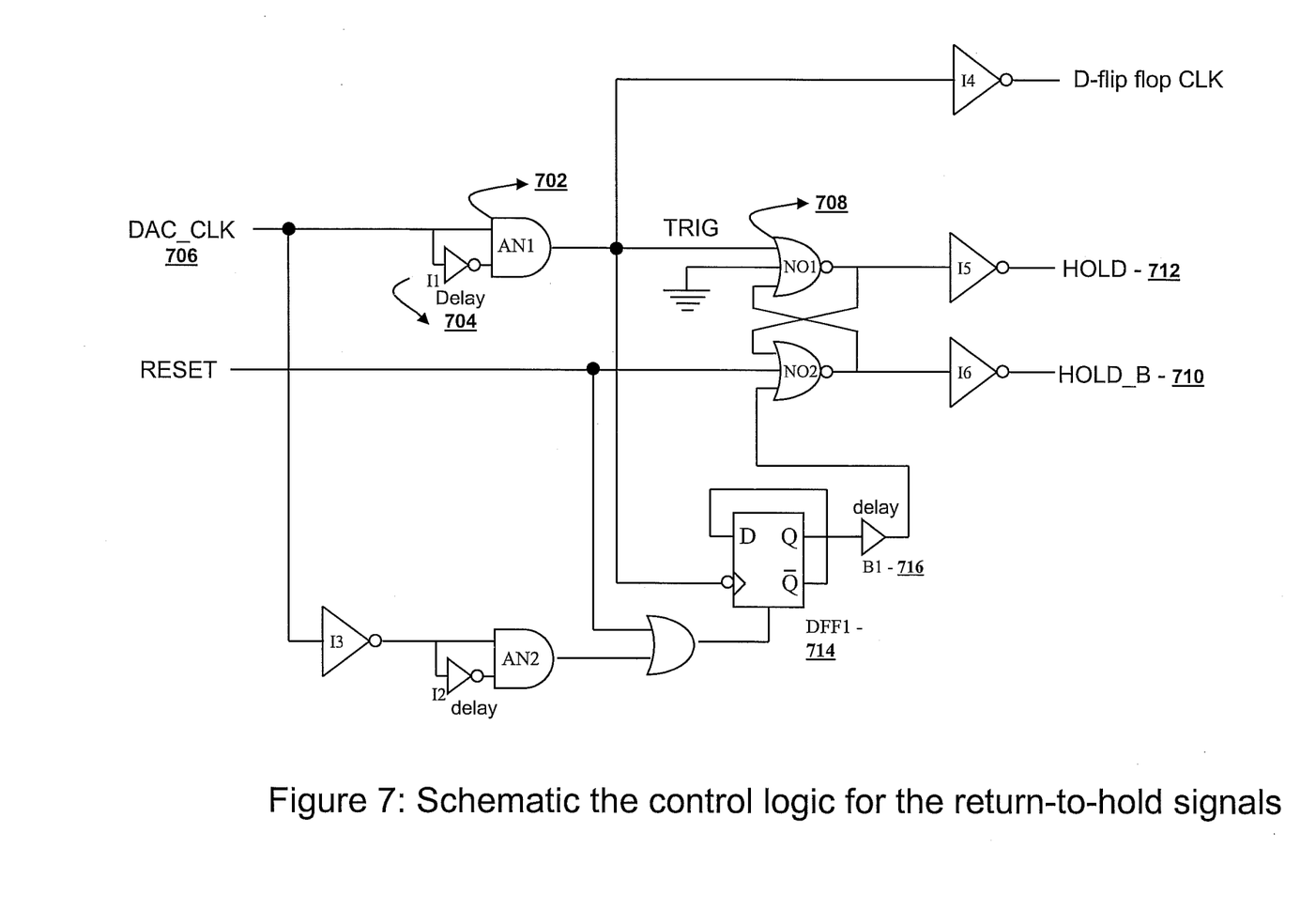
FIG. 7 illustrates a schematic of the control logic for the return-to-hold signals

A circuit that generates the HOLD, HOLD_B and clock 608 for the D-flip flops is shown in FIG. 7. A RESET signal is used to place the RS flip flop shown into the reset state where HOLD_B is HIGH and HOLD is LOW. The D-flip flop DFF1 is also cleared by the same RESET signal.

The logic gates AN1 702 and I1 704 create a pulse upon the arrival of the rising edge of DAC_CLK 706, where DAC_CLK 706 is the main clock of the converter. The duration of the created pulse is determined by the delay through inverter I1 704. Typically, a 1 ns to 2 ns pulse width is enough to set an RS flip flop found in today silicon technologies. When this pulse appears at the input of NO1 708, it sets HOLD_B 710 to LOW, and HOLD 712 to HIGH. At this time, the I-to-V is in the "hold" stage where its voltage remains constant. The falling edge of this pulse then clocks the flip flop DFF1 714 to produce a HIGH at the output Q. After a delay determined by B1 716, the output of B1 716 then goes HIGH and sets the HOLD_B 710 back to HIGH, and HOLD 712 back to LOW; also the I-to-V starts to convert the current produced by the new DAC code.

The falling edge of DAC_CLK then generates a pulse which in turn resets DFF1 714. The circuit of FIG. 7 repeats the same operation for every rising edge of DAC_CLK.

One advantage of this circuit is that, logic gates can be easily designed to produce an optimal cross point for HOLD 712 and HOLD_B 710. This optimal cross point yields a minimum disturbance to the summing junctions of the amplifier which is essential for high speed operations.

Further, with sufficient bandwidth in the amplifier, the switching scheme is insensitive to any variation in HOLD_B pulse width. This implies that the circuit is insensitive to the jitter introduced by the logic gates in FIG. 7. This is yet another advantage of the present invention.

Since the falling edge of TRIG is used to clock the D-flip flop array which stores the DAC codes, the code change will take place when the I-to-V converter is in the "hold" mode. When the delay through inverter I1 and buffer B1 are approximately equal, the DAC codes are guaranteed to change in the middle of the "hold" period.

In practice, there will be a voltage developed across the terminal of switch S3 506 during the "hold" period due to the non-zero on-resistance of the MOS device which realizes S3 506, and the amount of current flowing through the resistors R1 508 and R2 510. This voltage modulates the drain voltage of the current cells and can cause distortion. However, with careful design to minimize the on-resistance of S3 506, and if necessary, cascoding the current cells, this issue can be easily overcome.

CONCLUSION

A system and method has been shown in the above embodiments for the effective implementation of a return-to-hold switching scheme for a DAC output stage. While various preferred embodiments have been shown and described, it will be understood that there is no intent to limit the invention by such disclosure, but rather, it is intended to cover all modifications falling within the spirit and scope of the invention, as defined in the appended claims. For example, the present invention should not be limited by specific hardware, etc.

The invention claimed is:

1. A method to eliminate inter-symbol interference error at an I-to-V output stage of a current steering DAC having a plurality of current cells, said output stage comprising at least an I-to-V amplifier having summing junctions SJP and SJN, feedback resistances R1 and R2, and feedback capacitances C1 and C2, said method comprising the steps of:
    disconnecting said feedback resistors R1 and R2 and said current cells from said summing junctions SJP and SJN of said amplifier in said output stage;
    connecting said feedback resistors R1 and R2 together to form a resistor string across outputs of said output stage, with said feedback capacitors C1 and C2 creating a hold period to hold output voltage of said I-to-V amplifier when said I-to-V amplifier is not connected to said current cells of said current steering DAC;
    using the I-to-V amplifier as a buffer to maintain a CM level at drains of said current cells during said hold period by connecting the outputs of said current cells to midpoint of said resistor string; and changing DAC codes while outputs of said current cells are in said hold mode, and
disconnecting the outputs of said current cells from each other after the DAC codes are changed and re-connecting said feedback resistors and appropriate outputs of said current cells back to the summing junctions of said I-to-V converter.

2. The method of claim 1, wherein said step of disconnecting said feedback resistors R1 and R2 and said current cells from said summing junctions SJP and SJN is done via a first and second switch.

3. The method of claim 2, wherein said method further comprises a third switch to short circuit outputs of said current cells during said hold period, said third switch connecting one end of said feedback resistors R1 and R2 together and the other end of said resistors being connected to outputs of said I-to-V amplifier.

4. The method of claim 3, wherein said first and second switches are driven by a first hold signal and said third switch is driven by a second hold signal, said first hold signal becoming LOW with a rising edge of a clock driving said DAC to disconnect said feedback resistors R1 and R2 from said summing junctions of I-to-V amplifier by turning off said first and second switch and at the same time said second hold signal becoming HIGH and connecting left hand sides of resistors R1 and R2 via said third switch.

5. The method of claim 3, wherein logic gates are designed to produce an optimal cross-point yielding a minimal disturbance to said summing junctions of said I-to-V amplifier.

6. The method of claim 3, wherein said I-to-V amplifier has sufficient bandwidth to be insensitive to a variation in the pulse width associated with said first hold signal.

7. An apparatus to eliminate inter-symbol interference error at an I-to-V output stage of a current steering DAC having a plurality of current cells, said output stage comprising at least an I-to-V amplifier having summing junctions SJP and SJN, feedback resistances R1 and R2, and feedback capacitances C1 and C2, said apparatus comprising:

means for disconnecting said feedback resistors R1 and R2 and said current cells from said summing junctions SJP and SJN of said amplifier in said output stage;

means for connecting said feedback resistors R1 and R2 together to form a resistor string across outputs of said output stage, with said feedback capacitors C1 and C2 creating a hold period to hold output voltage of said I-to-V amplifier when said I-to-V amplifier is not connected to said current cells of said current steering DAC;

means for using the I-to-V amplifier as a buffer to maintain a CM level at drains of said current cells during said hold period by connecting the outputs of said current cells to midpoint of said resistor string; and changing DAC codes while outputs of said current cells are in said hold mode, and means for disconnecting the outputs of said current cells from each other after the DAC codes are changed and re-connecting said feedback resistors and appropriate outputs of said current cells back to the summing junctions of said I-to-V converter.

8. The apparatus of claim 7, wherein said means for disconnecting said feedback resistors R1 and R2 and said current cells from said summing junctions SJP and SJN is done via a first and second switch.

9. The apparatus of claim 8, wherein said apparatus comprises a third switch to short circuit outputs of said current cells during said hold period, said third switch connecting one end of said feedback resistors R1 and R2 together and the other end of said resistors being connected to outputs of said I-to-V amplifier.

10. The apparatus of claim 9, wherein said first and second switches are driven by a first hold signal and said third switch is driven by a second hold signal, said first hold signal becoming LOW with a rising edge of a clock driving said DAC to disconnect said feedback resistors R1 and R2 from said summing junctions of I-to-V amplifier by turning off said first and second switch and at the same time said second hold signal becoming HIGH and connecting left hand sides of resistors R1 and R2 via said third switch.

11. The apparatus of claim 9, wherein logic gates are designed to produce an optimal cross-point yielding a minimal disturbance to said summing junctions of said I-to-V amplifier.

12. The apparatus of claim 9, wherein said I-to-V amplifier has sufficient bandwidth to be insensitive to a variation in the pulse width associated with said first hold signal.

13. A circuit to eliminate inter-symbol interference error at an I-to-V output stage of a current steering DAC having a plurality of current cells, said circuit comprising:

an I-to-V amplifier having summing junctions SJP and SJN;

a first feedback resistance R1;

a second feedback resistance R2;

a first feedback capacitance C1;

a second feedback capacitance C2;

a first switch S1 used to connect/disconnect R1 and C1 to said summing junction SJP and a second switch S2 used to connect/disconnect R2 and C2 to said summing junction SJN;

a third switch S3 used to connect/disconnect said feedback resistors R1 and R2 together and, when connected, R1 and R2 forming a resistor string across outputs of said output stage, with said feedback capacitors C1 and C2 creating a hold period to hold output voltage of said I-to-V amplifier when said I-to-V amplifier is not connected to said current cells of said current steering DAC; and wherein said I-to-V amplifier acts as a buffer to maintain a CM level at drains of said current cells during said hold period by connecting the outputs of said current cells to midpoint of said resistor string and, after DAC codes are changed, the outputs of said current cells are disconnected from each other and said feedback resistors and appropriate outputs of said current cells are reconnected back to the summing junctions of said I-to-V converter.

14. The circuit of claim 13, wherein said first and second switches S1 and S2 are driven by a first hold signal and said third switch is driven by a second hold signal, said first hold signal becoming LOW with a rising edge of a clock driving said DAC to disconnect said feedback resistors R1 and R2 from said summing junctions of I-to-V amplifier by turning off said first and second switches S1 and S2, and at the same time, said second hold signal becoming HIGH and connecting left hand sides of resistors R1 and R2 via said third switch S3.

15. The circuit of claim 13, wherein said logic gates are designed to produce an optimal cross-point yielding a minimal disturbance to said summing junctions of said I-to-V amplifier.

16. The circuit of claim 13, wherein said I-to-V amplifier has sufficient bandwidth to be insensitive to a variation in the pulse width associated with said first hold signal.

17. A circuit to eliminate inter-symbol interference error at an I-to-V output stage of a current steering DAC having a plurality of current cells, said circuit comprising:

a first switch S1 used to connect/disconnect feedback resistance R1 and feedback capacitance C1 to a summing junction SJP of a I-to-V amplifier;

a second switch S2 used to connect/disconnect feedback resistance R2 and feedback capacitance C2 to a summing junction SJN of said I-to-V amplifier;

a third switch S3 used to connect/disconnect said feedback resistors R1 and R2 together and, when connected, R1 and R2 forming a resistor string across outputs of said output stage, with said feedback capacitors C1 and C2 creating a hold period to hold output voltage of said I-to-V amplifier when said I-to-V amplifier is not connected to said current cells of said current steering DAC; and wherein said I-to-V amplifier acts as a buffer to maintain a CM level at drains of said current cells during said hold period by connecting the outputs of said current cells to midpoint of said resistor string and, after DAC codes are changed, the outputs of said current cells are disconnected from each other and said feedback resistors and appropriate outputs of said current cells are reconnected back to the summing junctions of said I-to-V amplifier.

18. The circuit of claim 17, wherein said first and second switches S1 and S2 are driven by a first hold signal and said third switch is driven by a second hold signal, said first hold signal becoming LOW with a rising edge of a clock driving said DAC to disconnect said feedback resistors R1 and R2 from said summing junctions of I-to-V amplifier by turning off said first and second switches S1 and S2, and at the same time, said second hold signal becoming HIGH and connecting left hand sides of resistors R1 and R2 via said third switch S3.

19. The circuit of claim 17, wherein logic gates are designed to produce an optimal cross-point yielding a minimal disturbance to said summing junctions of said I-to-V amplifier.

20. The circuit of claim 17, wherein said I-to-V amplifier has sufficient bandwidth to be insensitive to a variation in the pulse width associated with said first hold signal.

* * * * *

UNITED STATES PATENT AND TRADEMARK OFFICE
CERTIFICATE OF CORRECTION

| | |
|---|---|
| PATENT NO. | : 7,307,568 B1 |
| APPLICATION NO. | : 11/476476 |
| DATED | : December 11, 2007 |
| INVENTOR(S) | : Khiem Nguyen |

Page 1 of 1

It is certified that error appears in the above-identified patent and that said Letters Patent is hereby corrected as shown below:

On Title page

Page 1, Line 25, please insert

Item

-- Related U.S. application Data (60) Provisional application No. 60/629,621 filed on November 19, 2004. --

Signed and Sealed this

Seventh Day of October, 2008

JON W. DUDAS
*Director of the United States Patent and Trademark Office*